(12) United States Patent
Fazal et al.

(10) Patent No.: US 10,097,268 B2
(45) Date of Patent: Oct. 9, 2018

(54) SYSTEMS AND METHODS FOR REDUCING ADJACENT CHANNEL LEAKAGE RATIO

(71) Applicants: Irfan Muhammad Fazal, Ottawa (CA); Robert Leroux, Ottawa (CA)

(72) Inventors: Irfan Muhammad Fazal, Ottawa (CA); Robert Leroux, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/366,125

(22) Filed: Dec. 1, 2016

(65) Prior Publication Data

US 2018/0159627 A1 Jun. 7, 2018

(51) Int. Cl.
*H04J 14/02* (2006.01)
*H04B 10/2575* (2013.01)
(Continued)

(52) U.S. Cl.
CPC ..... *H04B 10/2575* (2013.01); *G02B 6/12009* (2013.01); *H01S 5/0612* (2013.01); *H04B 10/2504* (2013.01); *H04J 14/02* (2013.01)

(58) Field of Classification Search
CPC ............................. H04B 10/2575; H04J 14/02
See application file for complete search history.

(56) References Cited

U.S. PATENT DOCUMENTS

| 8,437,637 | B2 * | 5/2013 | Xu | ............... | H04B 10/272 |
| | | | | | 398/68 |
| 2006/0182446 | A1 * | 8/2006 | Kim | ............. | H04B 10/25752 |
| | | | | | 398/72 |

(Continued)

FOREIGN PATENT DOCUMENTS

| CN | 101272214 A | 9/2008 |
| EP | 1076429 A2 | 2/2001 |
| WO | 2015006983 A1 | 1/2015 |

OTHER PUBLICATIONS

International Search Report dated Jan. 26, 2018 for corresponding International Application No. PCT/CN2017/112118 filed Nov. 21, 2017.

*Primary Examiner* — Dzung Tran

(57) ABSTRACT

An analog radio over fiber (AROF) wavelength division multiplexing (WDM) system and method for reducing adjacent channel leakage ratio (ACLR) in a radio frequency signal provided by an AROF WDM system are provided. The AROF WDM system comprises a plurality of transmitters, a multiplexer, a demultiplexer, a plurality of receivers and a controller. Each transmitter is for receiving a radio frequency input signal and for modulating the radio frequency input signal onto an optical signal to obtain a modulated optical signal. The multiplexer is for receiving each modulated optical signal from the plurality of transmitters and for combining the modulated optical signals into a combined optical signal to be sent a distance over an optical fiber. The multiplexer has a pluralities of passbands with each passband having a center wavelength. The demultiplexer is for receiving the combined optical signal and for separating the combined optical signal back into the individual modulated optical signals. Each receiver is for receiving one of the modulated optical signals from the demultiplexer and for converting the received modulated optical signal into a radio frequency output signal. The controller is configured to detune, for each transmitter, one of that transmitter and the multiplexer relative to the other such that a wavelength of the modulated optical signal transmitted by that transmitter is longer than the center wavelength of a corresponding one of the plurality of passbands of the multiplexer.

14 Claims, 10 Drawing Sheets

(51) Int. Cl.
*H04B 10/25* (2013.01)
*H01S 5/06* (2006.01)
*G02B 6/12* (2006.01)

(56) References Cited

U.S. PATENT DOCUMENTS

| | | |
|---|---|---|
| 2009/0028552 A1 | 1/2009 | Zhang et al. |
| 2010/0142955 A1* | 6/2010 | Yu .................... H04B 10/25754 398/72 |
| 2013/0177317 A1* | 7/2013 | Rospsha .......... H04B 10/25754 398/93 |
| 2016/0033849 A1* | 2/2016 | Mazed .................. G02F 1/3132 398/48 |

\* cited by examiner

SYSTEMS AND METHODS FOR REDUCING ADJACENT CHANNEL LEAKAGE RATIO

FIELD OF THE INVENTION

The present invention pertains to the field of network communications, and in particular to systems and methods for reducing adjacent channel leakage ratio in multichannel communications networks.

BACKGROUND

Analog radio over fiber (AROF) is increasingly seen as a viable alternative to conventional digital optical transmission, e.g., the common public radio interface (CPRI), for the next generation wireless systems to directly transmit the analog signal to the antenna. A simple optical detector at the antenna-top converts the analog optical signal into analog electrical signal, to be amplified with a radio frequency (RF) power amplifier (PA) and transmitted into the free space, thereby reducing the complexity of requiring digital to analog conversion circuitry at the antenna top. This methodology, however, puts stringent demands on the optical link in terms of linearity, noise and crosstalk. One such important system parameter dependent on a combination of system linearity, noise and crosstalk is adjacent channel leakage ratio (ACLR). ACLR is defined by the international committee on 3GPP as the ratio of the integrated power in the adjacent channel to the integrated power in the channel of interest.

This background information is provided to reveal information believed by the applicant to be of possible relevance to the present invention. No admission is necessarily intended, nor should be construed, that any of the preceding information constitutes prior art against the present invention.

SUMMARY

An object of embodiments of the present invention is to provide a method and apparatus for reducing adjacent channel leakage ratio in a multichannel communications network.

In accordance with embodiments of the present invention, there is provided an analog radio over fiber (AROF) wavelength division multiplexing (WDM) system. The AROF WDM system comprises a plurality of transmitters, a multiplexer, a demultiplexer, a plurality of receivers and a controller. Each transmitter is for receiving a radio frequency input signal and for modulating the radio frequency input signal onto an optical signal to obtain a modulated optical signal. The multiplexer is for receiving each modulated optical signal from the plurality of transmitters and for combining the modulated optical signals into a combined optical signal to be sent a distance over an optical fiber. The multiplexer has a pluralities of passbands with each passband having a center wavelength. The demultiplexer is for receiving the combined optical signal and for separating the combined optical signal back into the individual modulated optical signals. Each receiver is for receiving one of the modulated optical signals from the demultiplexer and for converting the received modulated optical signal into a radio frequency output signal. The controller is configured to detune, for each transmitter, one of that transmitter and the multiplexer relative to the other such that a wavelength of the modulated optical signal transmitted by that transmitter is longer than the center wavelength of a corresponding one of the plurality of passbands of the multiplexer.

In accordance with embodiments of the present invention, there is also provided a method for reducing adjacent channel leakage ratio (ACLR) in a radio frequency signal provided by an analog radio over fiber (AROF) wavelength division multiplexing (WDM) system. The AROF WDM system comprises a plurality of transmitters, a multiplexer having a plurality of passbands with each passband having a center wavelength, a demultiplexer, a plurality of receivers and a controller operably coupled to the plurality of transmitters. The method comprises, for each transmitter, the controller detuning one of that transmitter and the multiplexer relative to the other such that the wavelength of a modulated optical signal transmitted by that transmitter is longer than the center wavelength of a corresponding one of the plurality of passbands of the multiplexer.

BRIEF DESCRIPTION OF THE FIGURES

Further features and advantages of the present invention will become apparent from the following detailed description, taken in combination with the appended drawings, in which.

It will be noted that throughout the appended drawings, like features are identified by like reference numerals.

DETAILED DESCRIPTION

Embodiments of the present invention are directed towards systems and methods for reducing adjacent channel leakage ratio in multichannel communications networks.

Figure 1:
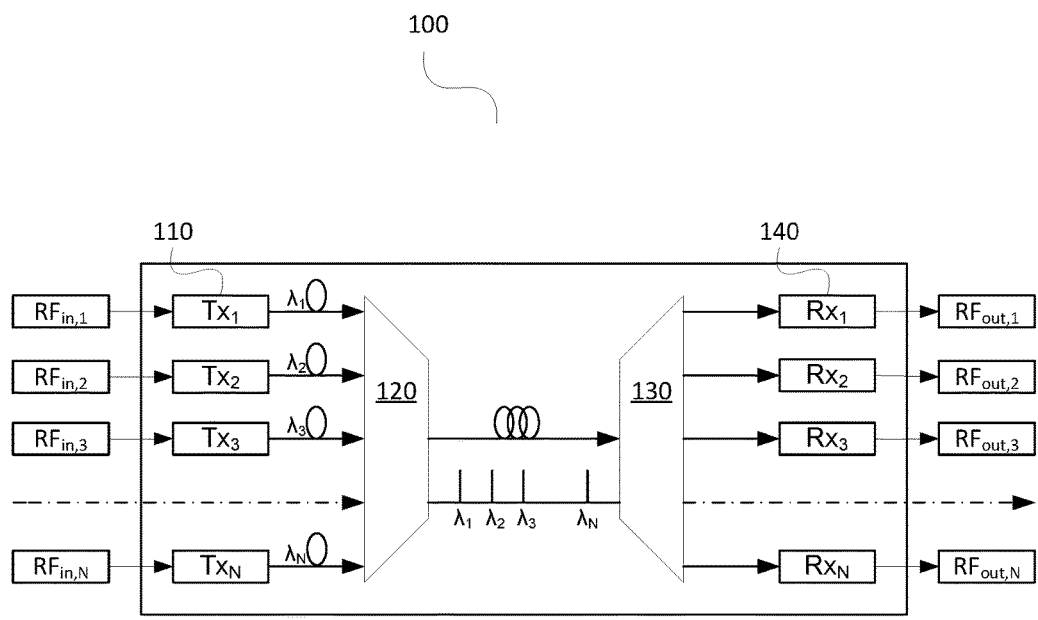
FIG. 1 illustrates, in a high-level functional block diagram, an example of an analog radio over fiber (AROF) wavelength division multiplexing (WDM) system.

FIG. 1 illustrates, in a high-level functional block diagram, an example of an analog radio over fiber (AROF) wavelength-division multiplexing (WDM) system 100. The AROF WDM system 100 comprises a plurality of transmitters (Tx) 110, a multiplexer (Mux) 120, a demultiplexer (DeMux) 130 and a plurality of receivers 140. Radio frequencies ($RF_{in,x}$) may be input into the transmitters ($Tx_x$) 110. Each $Tx_x$ 110 converts the received $RF_{in,x}$ into an optical signal having a different wavelength $\lambda_x$ for that $Tx_x$ 110. The optical signals are sent via optical fibers to the multiplexer 120 that combines the signals into a single optical fiber. The combined signal is sent a distance via a relatively long optical fiber (typically many kilometers in distance) to the demultiplexer 130 that separates the signals based on their wavelengths $\lambda_x$ and sends the separated signals via several optical fibers to corresponding receivers ($Rx_x$) 140. Each $Rx_x$ 140 converts their signal into a $RF_{out,x}$. The transmitters (Tx) 110 may comprise directly modulated laser (DML) diodes. The multiplexer 120 and demultiplexer 130 may comprise arrayed waveguide grating (AWG) devices. The receivers (Rx) 140 may comprise photodiodes. Transceivers (Tx/Rx) may be used for any Tx 110 or Rx 140.

Components of the AROF WDM system 100, such as the Tx 110, the multiplexer 120, and/or the demultiplexer 130 may be tuned in wavelength. To that end, the components may be coupled with heating/cooling elements electrically connected to a controller. As is known in the art, thermal tuning of the Tx 110 may take place by adding or removing heat by a thermoelectric cooler coupled to the Tx 110. One may tune the Tx 110 by tuning the refractive index of the laser cavity, or the refractive index of wavelength-selective reflective elements forming the laser cavity, or both. Typically, each $Tx_x$ will be tuned to transmit an optical signal at a desired wavelength $\lambda_x$. In some embodiments, it is possible to tune the multiplexer 120 and demultiplexer 130 by using a heating/cooling element coupled to the multiplexer 120 or demultiplexer 130. The receivers (Rx) 140 may comprise photodiodes.

Optical fiber communications typically operate in a wavelength region corresponding to one of several "telecom windows". A wavelength range of the optical signal may cover band C and band L recommended by the International Telecommunication Union-Telecommunication Standardization Sector (ITU-T), or any other required wavelength range and wavelength spacing. The C band describes one window that is widely used and utilizes wavelengths around 1.5 um (1530-1565 nm). The optical losses of silica fibers are lowest in this region.

Figure 2:
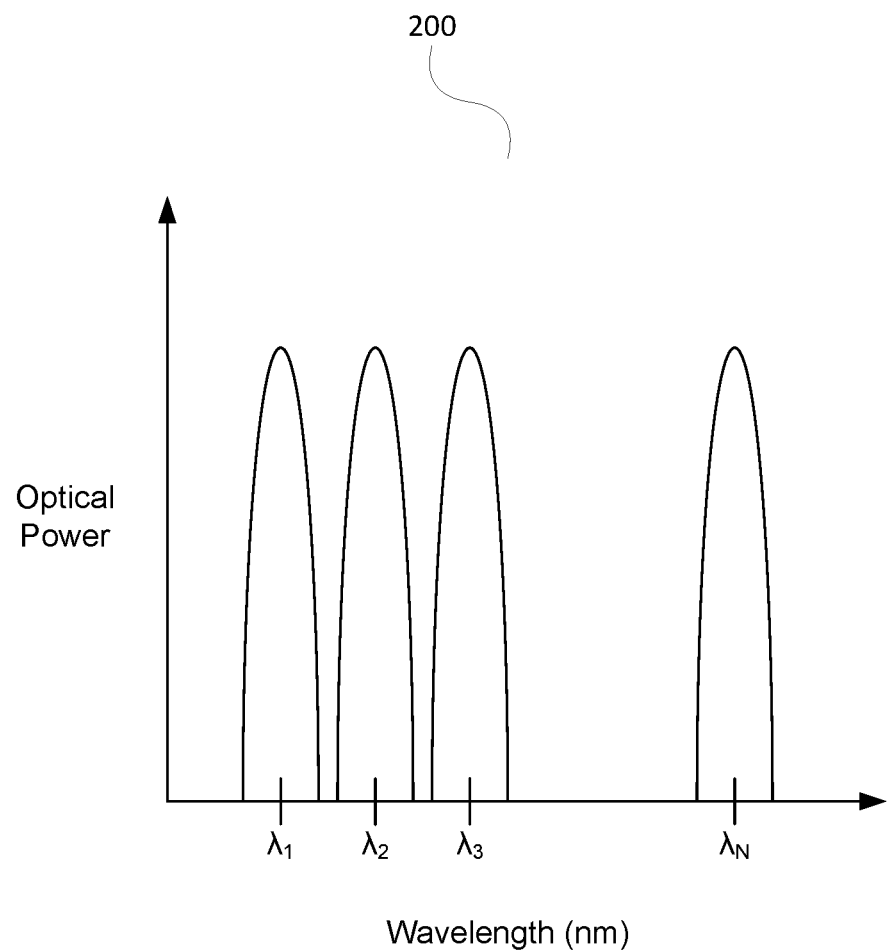
FIG. 2 schematically illustrates spectral profiles of optical signals generated by each transmitter in the AROF WDM system.

FIG. 2 schematically illustrates spectral profiles of passbands 200 of ports on a multiplexer 120 in the AROF WDM system 100. Each passband has a center wavelength $\lambda_x$. Typically, the center wavelengths $\lambda_x$ correspond with an ITU channel. As long as the wavelengths $\lambda_x$ are sufficiently spaced apart, the optical signals will not interfere with each other when combined at the multiplexer 120 so that the signals can be separated at the demultiplexer 130. In typical uses of the AROF WDM system, each Tx 110 is tuned to emit optical signals having a wavelength equal to the center wavelength of its corresponding passband. This tuning provides optimal optical power. The higher the optical power, the longer the optical signal can travel in the optical fiber without the need for amplification (and thus added cost of an amplifier along the path between the multiplexer 120 and demultiplexer 130).

Figure 3:
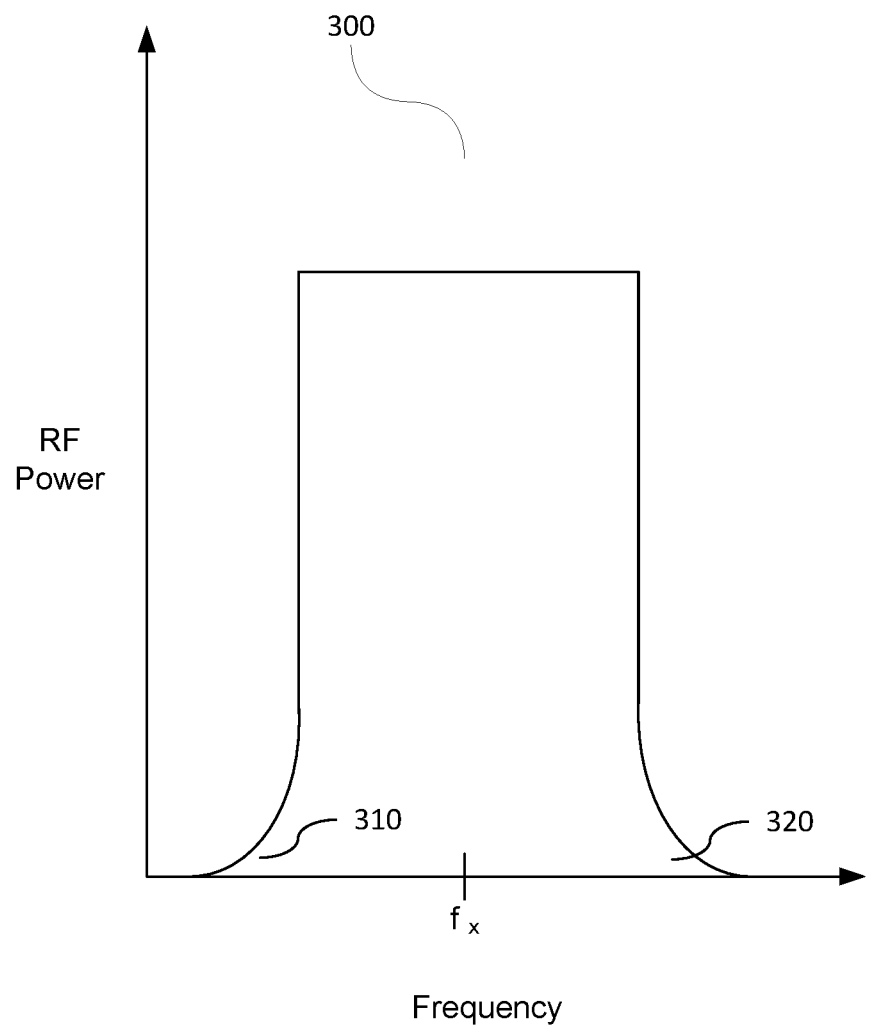
FIG. 3 schematically illustrates a spectral profile of a modulated analog radio frequency (RF) signal.

FIG. 3 schematically illustrates a spectral profile of a modulated analog radio frequency (RF) signal 300. Areas 310 and 320 are regions of distortion of the modulated analog RF signal 300 which comprise a portion of the ACLR. Adjacent channel leakage may be caused by many detrimental effects, which may include, for example, back reflection (i.e., due to Rayleigh scattering), four-wave mixing, self-phase modulation (SPM), and Stimulated Brillouin scattering (SBS). Each of these effects may occur in an optical fiber span between the Tx 110 and the Rx 140 in the AROF WDM system 100, causing distortion of the analog RF signal.

As noted above, one source of noise which contributes to the degradation of ACLR is the back-reflection of optical power from the optical devices (Tx 110, multiplexer 120, demultiplexer 130, Rx 140) and the fiber. The light reflected back enters the laser (i.e., one type of Tx 110) and adds to the noise by destabilizing the laser and thus degrading the signal quality. In an AROF WDM system, sources of back-reflection include the multiplexer 120, the demultiplexer 130 and the optical fiber. A detrimental effect of back-reflection may be mitigated by using high-isolation optical isolators in each optical link. However, this would be costly on a massive network deployed scale.

As will be discussed below, by detuning (i.e., lowering) the Tx 110 optical frequency away from a multiplexer 120/demultiplexer 130 (such as an AWG) by approximately 25 GHz to 30 GHz (i.e., detuning the laser wavelength such that it is longer than the central wavelength of a corresponding passband in the multiplexer 120 by a relatively small amount), the ACLR may be improved by approximately 3 dB to 5 dB.

Figure 4:
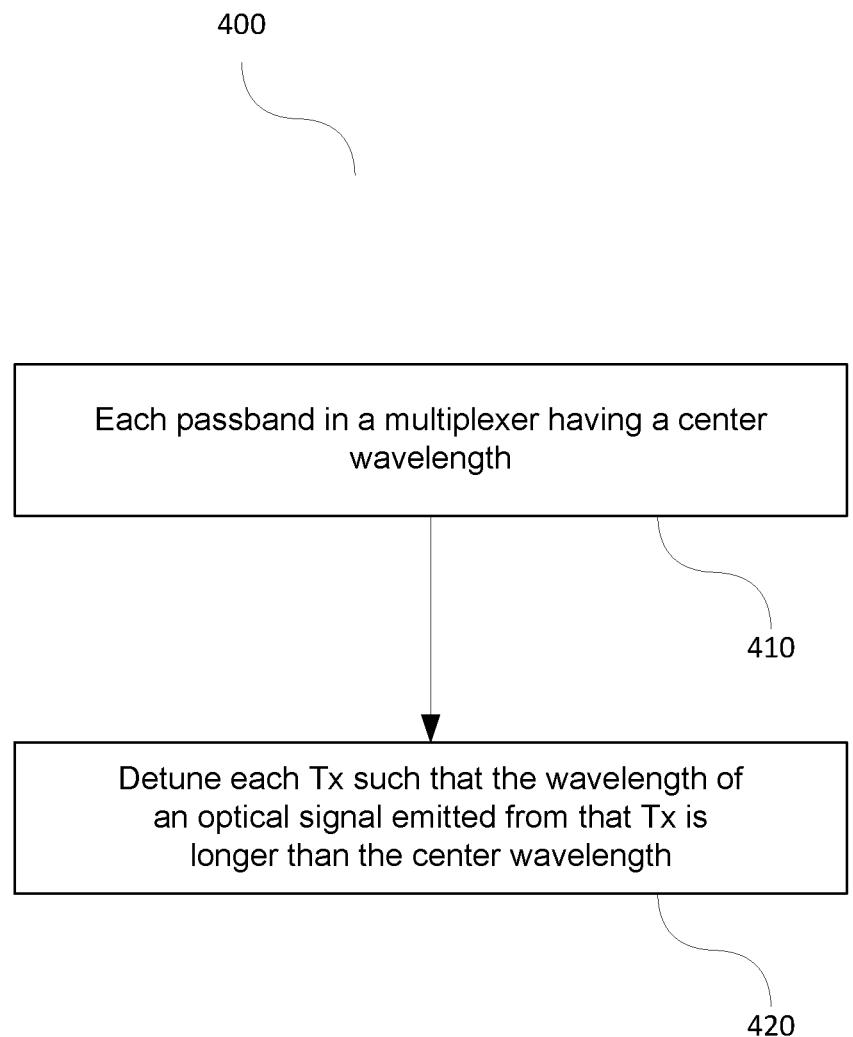
FIG. 4 illustrates, in a flowchart, an example of a method of improving ACLR in a radio frequency signal provided by an AROF WDM system, in accordance with an embodiment of the present invention.

FIG. 4 illustrates, in a flowchart, an example of a method of reducing ACLR in a radio frequency provide by an AROF WDM system (400), in accordance with an embodiment of the present invention. As is noted above, in an AROF WDM system 100, each Tx 110 corresponds to a passband of a port of the multiplexer 120. Each passband in the multiplexer 120 has a center wavelength (410) corresponding to an optical channel. The controller electrically connected to the AROF WDM system 100 detunes each $Tx_x$ 110 such that the wavelength $\lambda'_x$ of an optical signal emitted from that detuned $Tx_x$ 110 is longer than the center wavelength $\lambda_x$ of a corresponding passband in the multiplexer 120 (420). Alternatively, the multiplexer 120 (and possibly the demultiplexer 130) may be detuned relative to each $Tx_x$ 110 such that the center wavelength of each passband in the multiplexer 120 (and demultiplexer 130) is shorter than the the wavelength of an optical signal emitted from a corresponding $Tx_x$. The tuning and detuning may be performed thermoelectrically via a controller electrically connected to thermal heating/cooling components in the Tx 110 (or the multiplexer 120/demultiplexer 130 for the alternative detuning step). Other steps may be added to the method (400), including monitoring the ACLR in the $RF_{out,x}$ signal, and detuning the demultiplexer, e.g. AWG demultiplexer, to match the detuning of the multiplexer, e.g. AWG multiplexer.

As will be discussed below, the detuning in step (420) comprises the controller lowering the optical frequency of optical signals sent by each $Tx_x$ 110 such that that each $Tx_x$ 110 produces optical signals at optical frequencies that are between 25 GHz to 30 GHz lower than those corresponding to predetermined optimal center wavelengths $\lambda_x$ (i.e., those corresponding to the center wavelengths $\lambda_x$ of corresponding passbands in the multiplexer 120). Lowering the optical frequency by 25 GHz to 30 GHz is equivalent to increasing the transmission wavelength by approximately 0.2 nm to 0.24 nm.

Figure 5:
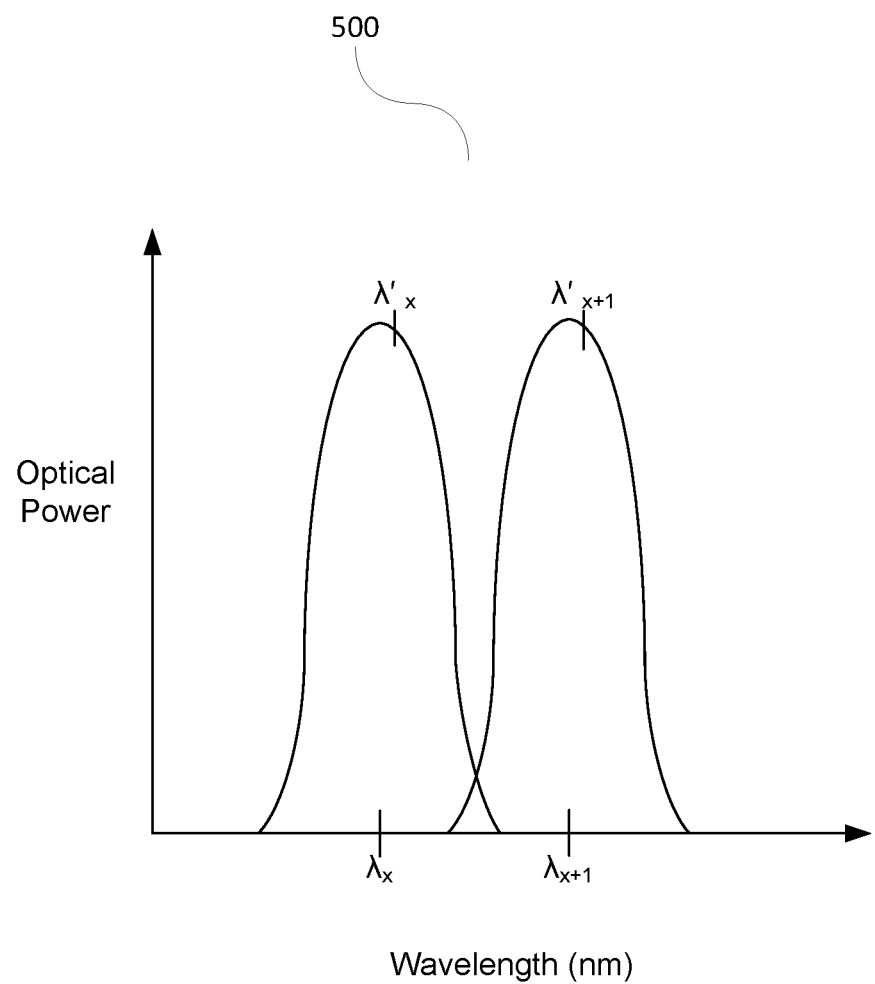
FIG. 5 schematically illustrates spectral profiles of two optical signals where the transmitters have been detuned.

FIG. 5 schematically illustrates spectral profiles of two passbands where the respective Tx 110 have been detuned to transmit at wavelengths $\lambda'_x$ and $\lambda'_{x+1}$. By detuning the Tx 110, ACLR can be reduced. As was noted above, each $Tx_x$ 110 may be detuned lower by approximately 25 GHz to 30

GHz, which corresponds to an increase from the corresponding passband central wavelength $\lambda_x$ by 0.2 nm to 0.24 nm. This level is shown below to be enough to decrease the ACLR by 3 dB to 5 dB.

To demonstrate ACLR reduction, an experiment was set up using an AROF WDM system similar to the AROF WDM system 100 in FIG. 1. In the experiment, the RF signal used was an analog 20 MHz LTE signal at 2.1 GHz of RF carrier. Sixteen copies of the RF signal were generated with each signal independently modulating a directly modulated laser (DML) (i.e., Tx 110) each. The center wavelengths of the 16 DML's were tuned to the 100 GHz ITU grid from 1549.32 nm to 1560.61 nm. All 16 modulated DML's were multiplexed using an arrayed-waveguide based commercially available multiplexer (i.e., multiplexer 120) and after a 12 Km SMF-28e fiber were de-multiplexed with the same (i.e., same type of device used as a multiplexer 120 and demultiplexer 130). The multiplexer 120 and demultiplexer 130 have adjacent channel crosstalk of 25 dB and non-adjacent channel crosstalk of 30 dB. Each DML (i.e., Tx 110) is transmitting 10 to 12 dBm optical power per channel. After transmission and de-multiplexing each optical signal was detected with an optical detector with 3.5 GHz of 3-dB bandwidth and the ACLR was measured with a RF spectrum analyzer.

To isolate possible causes of the performance degradation of each optical block, a detailed characterization for the single-channel case was carried out at Channel-7 (1541.35 nm) without any WDM neighbors. This provided insight into the penalty which each block (i.e., optical multiplexer 120, optical demultiplexer 130 and fiber) contributes to the overall performance. DML (Tx 110) output optical power was 12 dBm and the received power at the optical receiver (Rx 140) was varied with an optical attenuator.

Figure 6:
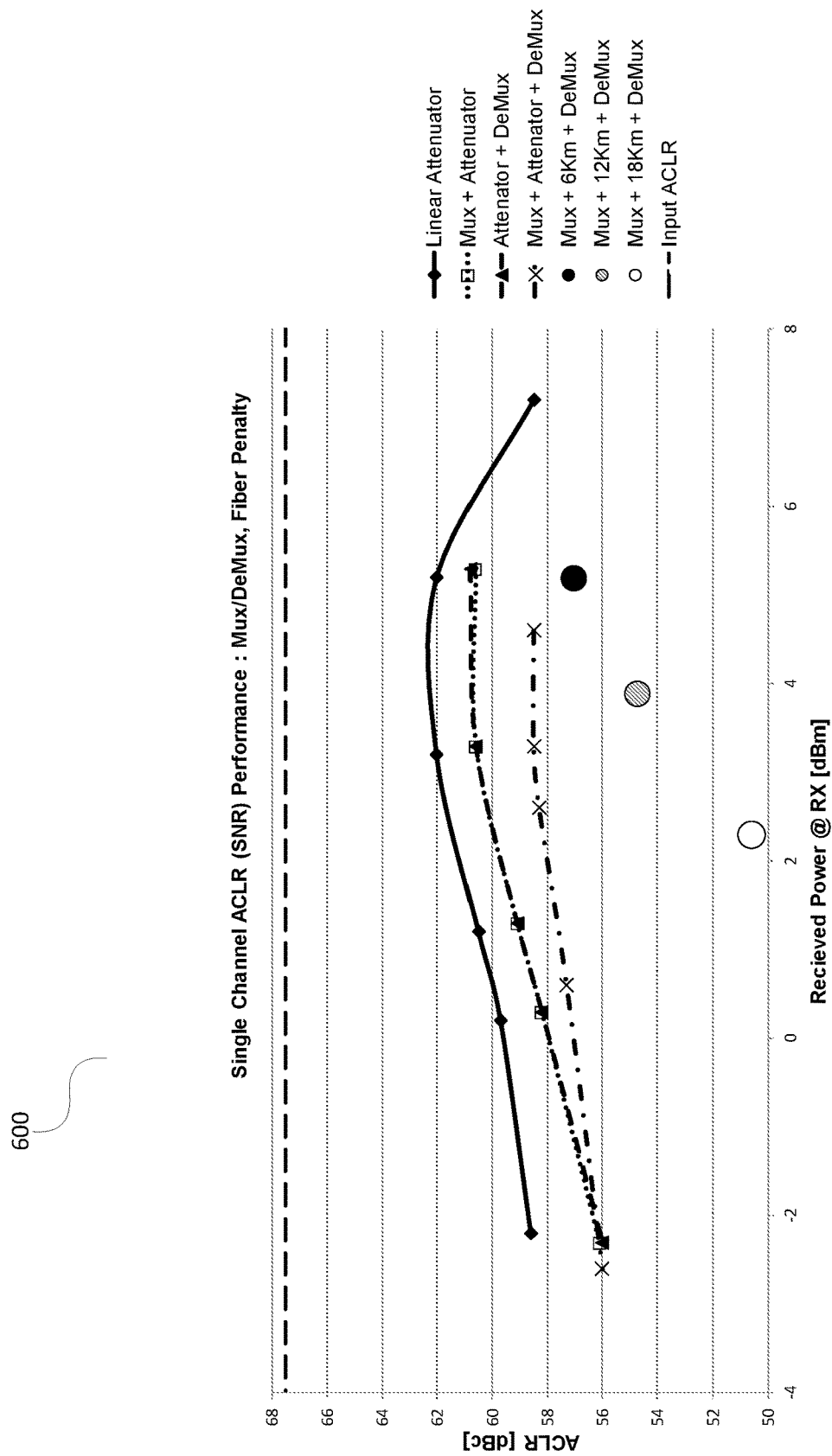
FIG. 6 illustrates, in a graph, the observed ACLR as a function of the power received at a receiver.

FIG. 6 illustrates, in a graph, the observed ACLR as a function of the power received at a receiver (Rx 140). FIG. 6 shows that as the received power at the Rx 140 is increased, initially there is an increase in the ACLR as the signal power with respect to relative intensity noise increases. However, after around 4.5 dBm of received power, as the received power is increased the non-linear distortions and back-reflection appear to dominate the integrated power in the adjacent channel resulting in a saturation of ACLR and further reduction. The AWG multiplexer 120/demultiplexer 130 incur around 1.8 dB of ACLR penalty individually (i.e., whether the AWG is used as a multiplexer 120 or as a demultiplexer 130). Both multiplexer 120 and demultiplexer 130 combined together incur 3.6 dB of ACLR penalty. This penalty is not attributed to crosstalk since the measurement was performed using a single channel. Thus, the penalty appears to be generated by the reflections from the device.

The SMF-28e fiber was available in three spools of 6 km each. As each additional spool is inserted into the link it incurs its own insertion loss (i.e., 0.2 dB/km×6 km=1.2 dB) as well as enhances the fiber non-linear effect. Table 1 below shows that when the fiber is increased from 12 km to 18 km, the received power at the optical Rx 140 is decreased by 1.8 dB. However, the ACLR degradation is twice that of 12 km (i.e., 4.1 dB compared to 2.3 dB). Thus, the degradation in ACLR is not linear and should not be attributed to the simple insertion loss. This suggests that the combined effect of Rayleigh and Stimulated Brillouin scattering (SBS) as well as self-phase modulation (SPM) in the fiber causes the additional penalty.

TABLE 1

| ACLR penalty of Fiber | | | |
|---|---|---|---|
| Fiber length | ACLR degradation [dB] | Received Optical Power [dBm] | Added Insertion Loss [dB] |
| 6 km | | 5.2 | |
| 12 km | 2.3 | 3.9 | 1.3 |
| 18 km | 4.1 | 2.3 | 1.6 |

Figure 7:
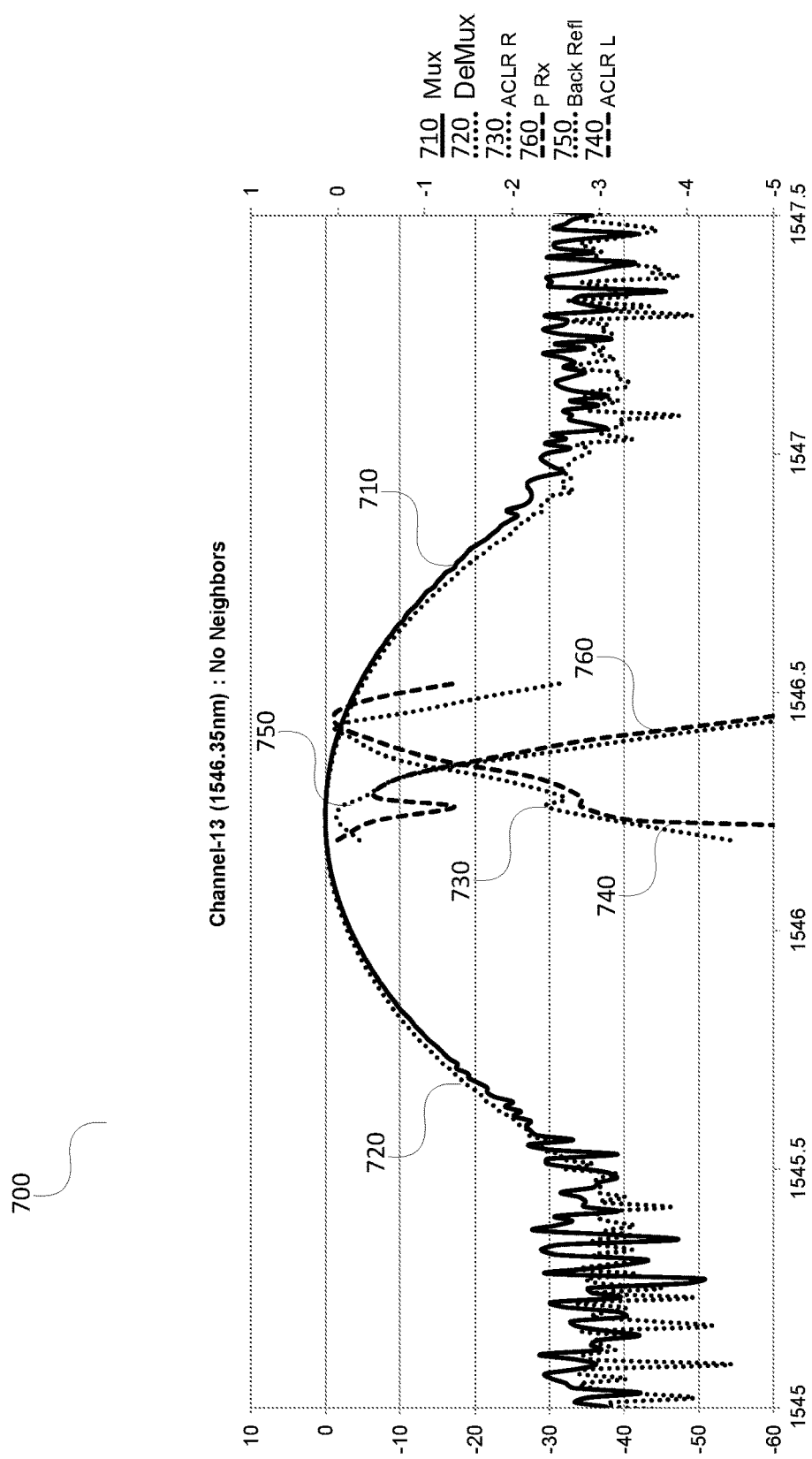
FIG. 7 illustrates, in a graph, a spectral profile of a multiplexer and demultiplexer channel overlaid with received optical power, back-reflected optical power and the measured ACLR for channel 13.
Figure 8:
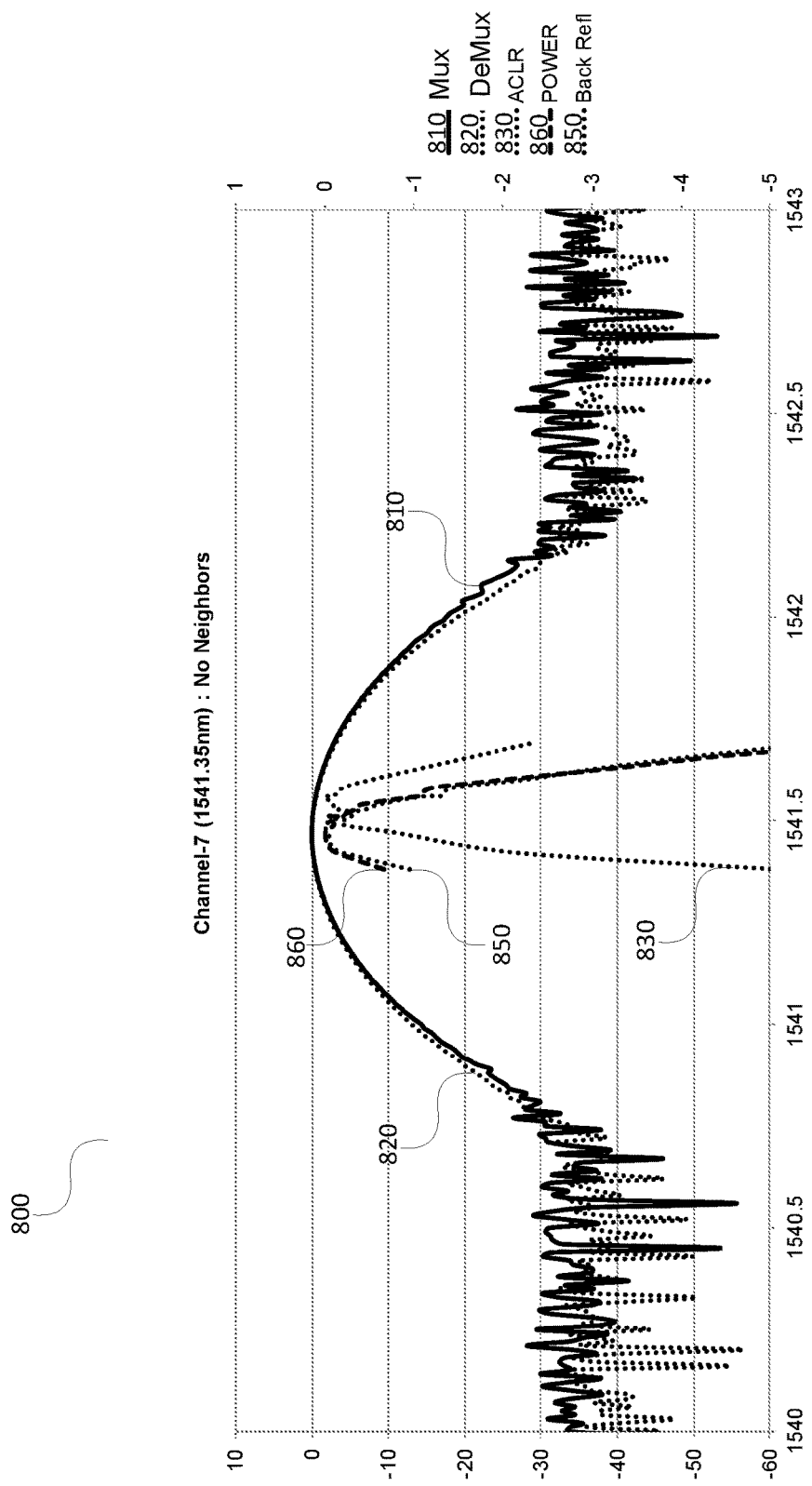
FIG. 8 illustrates, in a graph, a spectral profile of the multiplexer and demultiplexer channel overlaid with received optical power, back-reflected optical power and the measured ACLR for channel 7.
Figure 9:
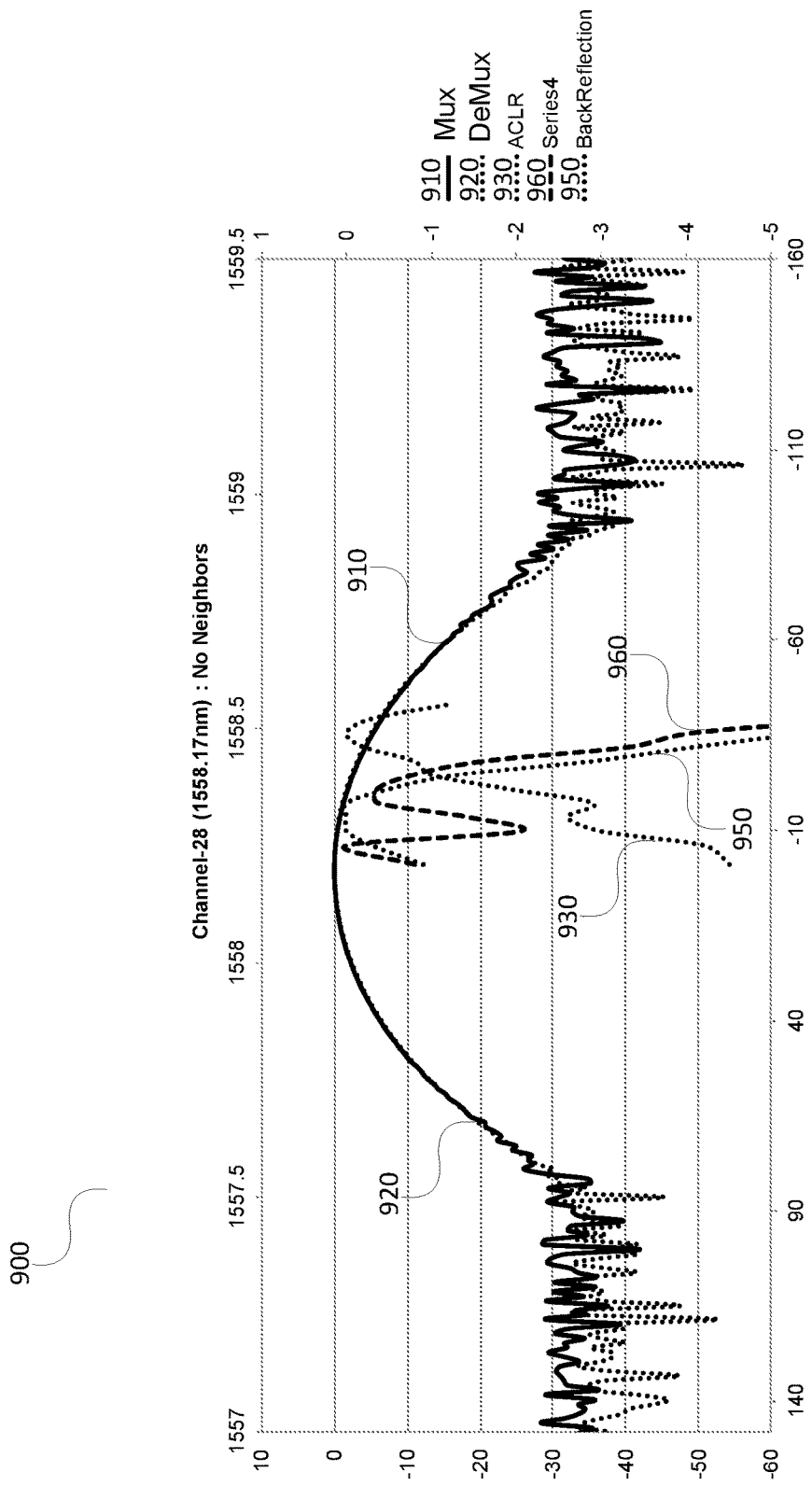
FIG. 9, illustrates, in a graph, a spectral profile of the multiplexer and demultiplexer channel overlaid with received optical power, back-reflected optical power and the measured ACLR for channel 28.

The single-channel results suggest that at the optimal received power of 4.5 dBm power, the ACLR is maximized. However, with the multiplexer 120, fiber and demultiplexer 130 in the link, the optimal ACLR and the maximal received power do not correlate. FIG. 7 illustrates, in a graph, a spectral profile of the multiplexer 120 and demultiplexer 130 channel (710 and 720, respectively) overlaid with received optical power (760), back-reflected optical power (750) and the measured ACLR (730 and 740) for channel 13 (1546.35 nm). FIG. 7 shows that the maximal received power is achieved when the signal is tuned to the passband center of the multiplexer 120/demultiplexer 130. However, as the signal is detuned away from the center towards the red side of the passband (i.e., increase in wavelength), an improvement of up to 3 dB to 5 dB occurs in the ACLR. This improvement may be attributed to the reduction of back-reflection which was measured and is plotted in FIG. 7 at 750. FIGS. 8 and 9, illustrate, in graphs, a spectral profile, or a passband, of the multiplexer 120 and demultiplexer 130 channel (810 and 820, respectively; and 910 and 920, respectively) overlaid with receive optical power (860; 960), back-reflected optical power (850; 950) and the measured ACLR (830; 930) for channels 7 (1541.35 nm) and 28 (1558.17 nm), respectively. Both FIGS. 8 and 9 also show an improvement of 3 dB in ACLR achieved with detuning.

Figure 10:
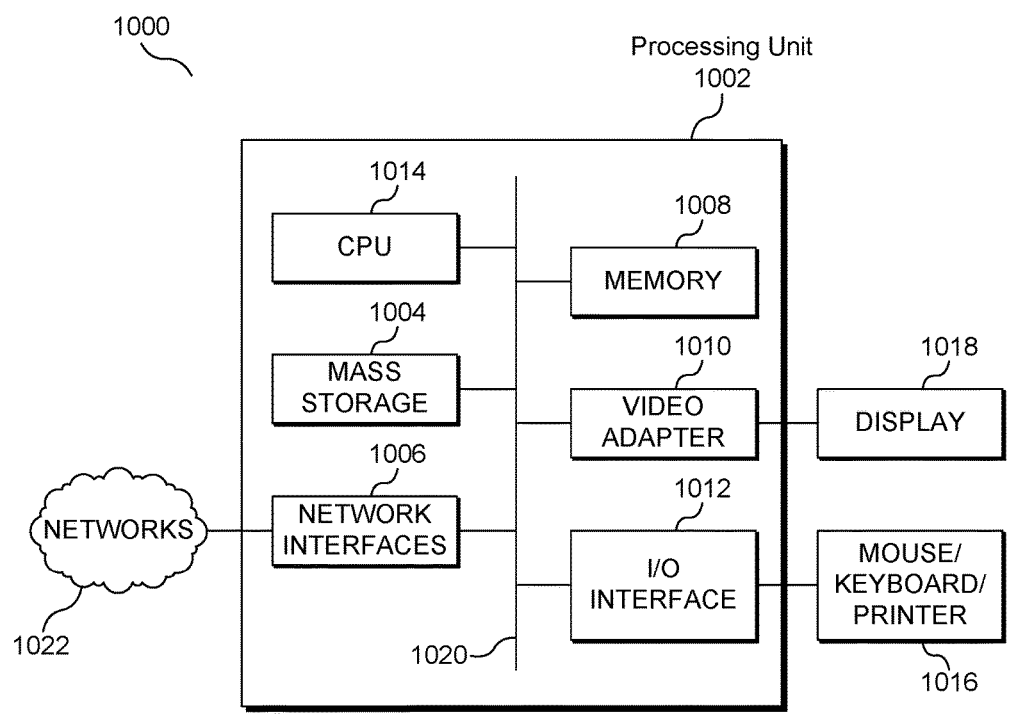
FIG. 10 is a block diagram of a computing system that may be used for implementing the devices and methods disclosed herein.

FIG. 10 is a block diagram of a computing system 1000 that may be used for implementing the devices and methods disclosed herein. Specific devices may utilize all of the components shown or only a subset of the components, and levels of integration may vary from device to device. Furthermore, a device may contain multiple instances of a component, such as multiple processing units, processors, memories, transmitters, receivers, etc. The computing system 1000 includes a processing unit 1002. The processing unit 1002 includes a central processing unit (CPU) 1014, memory 1008, and may further include a mass storage device 1004, a video adapter 1010, and an I/O interface 1012 connected to a bus 1020.

The bus 1020 may be one or more of any type of several bus architectures including a memory bus or memory controller, a peripheral bus, or a video bus. The CPU 1014 may comprise any type of electronic data processor. The memory 1008 may comprise any type of non-transitory system memory such as static random access memory (SRAM), dynamic random access memory (DRAM), synchronous DRAM (SDRAM), read-only memory (ROM), or a combination thereof. The memory 1008 may include ROM for use at boot-up, and DRAM for program and data storage for use while executing programs.

The mass storage 1004 may comprise any type of non-transitory storage device configured to store data, programs, and other information and to make the data, programs, and other information accessible via the bus 1020. The mass storage 1004 may comprise, for example, one or more of a solid state drive, hard disk drive, a magnetic disk drive, or an optical disk drive.

The video adapter 1010 and the I/O interface 1012 provide interfaces to couple external input and output devices to the processing unit 1002. As illustrated, examples of input and output devices include a display 1018 coupled to the video adapter 1010 and a mouse/keyboard/printer 1016 coupled to the I/O interface 1012. Other devices may be coupled to the processing unit 1002, and additional or fewer interface cards may be utilized. For example, a serial interface such as universal serial bus (USB) (not shown) may be used to provide an interface for an external device.

The processing unit 1002 may also include one or more network interfaces 1006, which may comprise wired links, such as an Ethernet cable, and/or wireless links to access nodes or different networks. The network interfaces 1006 allow the processing unit 1002 to communicate with remote units via the networks. For example, the network interfaces 1006 may provide wireless communication via one or more transmitters/transmit antennas and one or more receivers/receive antennas. The processing unit 1002 may be coupled to a local-area network 1022 or a wide-area network for data processing and communications with remote devices, such as other processing units, the Internet, or remote storage facilities.

Unless defined otherwise, all technical and scientific terms used herein have the same meaning as commonly understood by one of ordinary skill in the art to which this invention belongs.

Through the descriptions of the preceding embodiments, the present invention may be implemented by using hardware only or by using software and a necessary universal hardware platform. Based on such understandings, the technical solution of the present invention may be embodied in the form of a software product. The software product may be stored in a non-volatile or non-transitory storage medium, which can be a compact disk read-only memory (CD-ROM), USB flash disk, or a removable hard disk. The software product includes a number of instructions that enable a computer device (personal computer, server, or network device) to execute the methods provided in the embodiments of the present invention. For example, such an execution may correspond to a simulation of the logical operations as described herein. The software product may additionally or alternatively include number of instructions that enable a computer device to execute operations for configuring or programming a digital logic apparatus in accordance with embodiments of the present invention.

Although the present invention has been described with reference to specific features and embodiments thereof, it is evident that various modifications and combinations can be made thereto without departing from the invention. The specification and drawings are, accordingly, to be regarded simply as an illustration of the invention as defined by the appended claims, and are contemplated to cover any and all modifications, variations, combinations or equivalents that fall within the scope of the present invention.

We claim:

1. An analog radio over fiber (AROF) wavelength division multiplexing (WDM) system comprising:
    a plurality of transmitters, each transmitter configured to modulate a respective radio frequency input signal onto an optical signal to generate a corresponding modulated optical signal;
    a multiplexer configured to combine the modulated optical signals into a combined optical signal the multiplexer having a plurality of passbands corresponding to channels of the AROF WDM system, each passband having a respective center wavelength; and
    a controller configured to detune either one or both of the plurality of transmitters and the multiplexer such that a wavelength of the respective modulated optical signal generated by each transmitter is longer than the center wavelength of a corresponding one of the plurality of passbands of the multiplexer by an amount that is selected to reduce Adjacent Channel Leakage Ratio (ACLR) of the AROF WDM system.

2. The AROF WDM system as claimed in claim 1, wherein the controller is configured to detune each transmitter relative to the multiplexer by increasing the wavelength of the respective modulated optical signal relative to the center wavelength of the corresponding one of the plurality of passbands of the multiplexer.

3. The AROF WDM system as claimed in claim 1, wherein the controller is configured to detune the multiplexer by reducing the respective center wavelengths of the plurality of passbands of the multiplexer relative to the respective wavelengths of the modulated optical signals generated by the plurality of transmitters.

4. The AROF WDM system as claimed in claim 1, wherein the controller is configured to detune either one or both of the plurality of transmitters and the multiplexer such that the wavelength of the respective modulated optical signal generated by each transmitter is between 0.2 nanometers and 0.24 nanometers longer than the center wavelength of the corresponding passband of the multiplexer.

5. The AROF WDM system as claimed in claim 1, wherein each transmitter comprises a directly modulated laser diode.

6. The AROF WDM system as claimed in claim 5, wherein each transmitter further comprises a thermoelectric cooler, and wherein the controller is configured to detune each transmitter by lowering a temperature of the directly modulated laser diode using the thermoelectric cooler.

7. The AROF WDM system as claimed in claim 1, wherein the multiplexer comprises an arrayed waveguide grating (AWG) device.

8. The AROF WDM system as claimed in claim 7, further comprising a thermoelectric cooler associated with the AWG device, and wherein the controller is configured to detune each transmitter relative to the multiplexer by raising or lowering the temperature of the AWG device using the thermoelectric cooler.

9. A method of controlling an analog radio over fiber (AROF) wavelength division multiplexing (WDM) system comprising a plurality of transmitters configured to modulate respective radio frequency input signals onto an optical signal to generate corresponding modulated optical signals, and a multiplexer configured to combine the modulated optical signals into a combined optical signal, the method comprising a controller detuning either one or both of the plurality of transmitters and the multiplexer such that a wavelength of the respective modulated optical signal generated by each transmitter is longer than a center wavelength of a corresponding one of a plurality of passbands of the multiplexer by an amount that is selected to reduce Adjacent Channel Leakage Ratio (ACLR) of the AROF WDM system.

10. The method as claimed in claim 9, wherein the detuning comprises the controller detuning each transmitter relative to the multiplexer by increasing the wavelength of the respective modulated optical signal relative to the center wavelength of the corresponding one of the plurality of passbands of the multiplexer.

11. The method as claimed in claim 10, wherein the detuning comprises the controller detuning either one or both of the plurality of transmitters and the multiplexer such that the wavelength of the respective modulated optical signal generated by each transmitter is between 0.2 nanometers and 0.24 nanometers longer than a center wavelength of the corresponding passband of the multiplexer.

12. The method as claimed in claim 10, wherein each transmitter comprises a respective laser diode, and wherein the detuning comprises the controller detuning each transmitter by lowering a temperature of the respective laser diode.

13. The method as claimed in claim 9, wherein the detuning comprises the controller detuning the multiplexer by reducing the respective center wavelengths of the plurality of passbands of the multiplexer relative to the respective wavelengths of the modulated optical signals generated by the plurality of transmitters.

14. The method as claimed in claim 13, wherein the multiplexer comprises an arrayed waveguide grating (AWG) multiplexer, and wherein the detuning comprises changing a temperature of the AWG multiplexer.

* * * * *